US005508530A

United States Patent [19]
Nakajima

[11] Patent Number: 5,508,530
[45] Date of Patent: Apr. 16, 1996

[54] FIELD EFFECT TRANSISTOR

[75] Inventor: Shigeru Nakajima, Yokohama, Japan

[73] Assignee: Sumitomo Electric Industries, Ltd., Japan

[21] Appl. No.: 370,427

[22] Filed: Jan. 9, 1995

Related U.S. Application Data

[63] Continuation of Ser. No. 818,537, Jan. 9, 1992, Pat. No. 5,436,470.

[30] Foreign Application Priority Data

Jan. 14, 1991 [JP] Japan ................................. 3-2789
Jan. 14, 1991 [JP] Japan ................................. 3-2790
Jan. 14, 1991 [JP] Japan ................................. 3-2791
Jan. 14, 1991 [JP] Japan ................................. 3-2792

[51] Int. Cl.$^6$ .................... H01L 29/161; H01L 29/205
[52] U.S. Cl. ..................... 257/24; 257/27; 257/194
[58] Field of Search ......................... 257/194, 192, 257/20, 27, 24

[56] References Cited

U.S. PATENT DOCUMENTS 4,833,508  5/1989  Ishikawa .................... 257/192
5,091,759  2/1992  Shih et al. .................. 257/192

FOREIGN PATENT DOCUMENTS 0214047   3/1987   European Pat. Off. ........... 257/192
61-23364   1/1986   Japan ........................ 257/192
63-218165  12/1988  Japan ........................ 257/20
1268070   10/1989   Japan ........................ 257/192

OTHER PUBLICATIONS

"Parametric Analysis of GaInAs Devices For MM–Wave Applications," A. R. Jha, *International Journal of Infrared and Millimeter Waves*, vol. 10, No. 10, Oct. 1989, New York US pp. 1181–1191.

"A–10Gbit/s Laser Driver IC With i–AlGaAs/n–GaAs Doped–Channel Hetero–MISFETs (DMTs)," Suzuki et al., *Proceedings 11th GAAS IC Symposium*, IEEE, San Diego, CA, US, 22–25 Oct. 1989 pp. 129–132.

"AlGaAs/In GaAS/GaAs Quantum–Well Power MISFET at Millimeter–Wave Frequencies," Kim et al., *IEEE Electron Device Letters*, vol. 9, No. 11, Nov. 1988, New York US pp. 610–612.

*Primary Examiner*—Donald L. Monin, Jr.
*Attorney, Agent, or Firm*—Beveridge, DeGrandi, Weilacher, & Young

[57] ABSTRACT

The invention provides a FET by forming a channel layer in a layer including "n" type impurity at high concentration, which is sandwiched by a first semiconductor layer and a second semiconductor layer lightly doped with impurity. Therefore even when electrons in the channel layer obtain high energy, the electrons in this arrangement rush out essentially to the second semiconductor layer excelling in its electron carrying characteristic, thus a travelling speed of the electrons in the channel layer is not lowered. Furthermore, because the channel layer is allowed to include impurity at high concentration, the current drive capability can be improved.

13 Claims, 9 Drawing Sheets

PRIOR ART

PRIOR ART

PRIOR ART

FIELD EFFECT TRANSISTOR

This application is a continuation of U.S. patent application Ser. No. 07/818,537 filed on Jan. 9, 1992, now U.S. Pat. No. 5,436,470, which application is entirely incorporated herein by reference.

BACKGROUND OF THE INVENTION

1. Field of the Invention

The present invention relates to a structure of a field effect transistor (FET) necessitating a very high speed operation.

2. Related Background Art

Conventionally, as a very high speed device of this kind, for example, a first HEMT (high electron-mobility transistor) is introduced as shown in FIG. 1. An InP semiconductor substrate 1 is formed thereon with an undoped InP layer 2. The undoped InP layer 2 is formed thereon with an n-$Al_xIn_{1-x}As$ layer 3 on which donors are selectively added to $Al_xIn_{1-x}As$. The n-$Al_xIn_{1-x}As$ layer 3 is formed thereon with an $n^+$-InGaAs layer 4, a gate electrode 5 is formed in Schottky contact with the n-$Al_xIn_{1-x}As$ layer 3 exposed at a recess formed at a center portion, and ohmic electrodes 6 and 7 are formed on the $n^+$-InGaAs layer 4.

There is also a second HEMT having the same structure as the first HEMT but made of different composite materials. In the second HEMT, a GaAs semiconductor substrate is used instead of the InP semiconductor substrate 1, and an undoped GaAs layer, an n-AlGaAs layer, and an $n^+$-GaAs layer are laminated respectively instead of the undoped InP layer 2, the n-$Al_xIn_{1-x}As$ layer 3, and the $n^+$-InGaAs layer 4.

There is also a third HEMT with a structure as indicated in FIG. 2. Namely, an InP semiconductor substrate 11 is formed thereon with an undoped AlInAs layer 12. On the undoped AlInAs layer 12 is further formed an undoped $In_yGa_{1-y}As$ layer 13, and on this undoped $In_yGa_{1-y}As$ layer 13 is formed an n-$Al_xIn_{1-x}As$ layer 14 in which donors are selectively added to $Al_xIn_{1-x}As$. Further on the n-$Al_xIn_{1-x}As$ layer 14 is formed an $n^+$-InGaAs layer 15, and a gate electrode 16 is formed in Schottky contact with the n-$Al_xIn_{1-x}As$ layer 14 exposed at a recess formed at a center portion, and ohmic electrodes 17 and 18 are formed on the $n^+$-InGaAs layer 15.

In addition, there is a fourth HEMT having the same structure as the third HEMT but with different composite materials. In the fourth HEMT, a GaAs semiconductor substrate is used instead of an InP semiconductor substrate 11, and an undoped GaAs layer, an undoped $In_yGa_{1-y}As$ layer and an n-$Al_xGa_{1-x}As$ layer are laminated respectively instead of the undoped AlInAs layer 12, the undoped $In_yGa_{1-y}As$ layer 13, and the n-$Al_xIn_{1-x}As$ layer 14. The donors are selectively added to this n-$Al_xGa_{1-x}As$ layer. Further an $n^+$-InGaAs layer is used instead of the $n^+$-InGaAs layer 15.

However, as in the conventional first HEMT of the prior art hereinbefore described, for a system using heterojunction of AlInAs/InP, electrons travel in an InP layer being a channel and such electrons often produce a real space transfer for making transition to the AlInAs layer disposed in the upper layer of the InP layer. This real space transfer may be explained as follows. An energy band indicated in FIG. 3 is formed at a heterojunction portion of the n-AlInAs layer 3 and the undoped InP layer 2, and the two-dimensional electron gas is accumulated at the oblique-lined portion of the drawing. However, if a high electric field is applied across a drain and a source and the energy of the two-dimensional electron gas becomes higher, the electrons in the two-dimensional electron gas make transition to the n-AlInAs layer 3 as shown by the arrow mark in the drawing.

Generally, a high electric field is applied across a drain and a source during its operation, and as carrying characteristic of electrons is inferior in the AlInAs layer as compared to the InP layer, when this real space transfer occurs the high-frequency characteristic of the FET becomes degraded.

As in the second HEMT of the prior art hereinbefore described, for a system using the heterojunction of AlGaAs/GaAs, electrons travel in an GaAs layer which is to become a channel and such electrons sometimes produce a real space transfer for making transition to the AlGaAs layer disposed in the upper layer of the GaAs layer. For example, this real space transfer may be explained as follows. An energy band in FIG. 4 is formed at the heterojunction portion of the n-AlGaAs layer and the undoped GaAs, and the two-dimensional electron gas is accumulated at the oblique lined portion of the drawing. However, if a high electric field is applied across a drain and a source and the energy of the two-dimensional electron gas becomes higher, the electrons in the two-dimensional electron gas are transferred to the n-AlGaAs layer as shown by the arrow mark in the drawing.

Generally, a high electric field is applied across a drain and a source during its operation, and as a carrying characteristic of electrons is inferior in the AlGaAs layer as compared to the GaAs layer, thus when this real space transfer occurs it deteriorates the high-frequency characteristic of the FET.

In addition, as in the third HEMT of the prior art hereinbefore described, even in a system using the heterojunction of AlInAs/InGaAs, electrons travel in an InGaAs layer 13 which is to become a channel and such electrons sometimes produce real space transfer for making transition to the AlInAs layer 14 disposed in the upper layer of the InGaAs layer 13. This real space transition may be explained as below. An energy band in FIG. 5 is formed at the heterojunction portion of the n-AlInAs layer 14 and the undoped InGaAs layer 13, and the two-dimensional electron gas is accumulated at the oblique lined portion of the drawing. However, if a high electric field is applied across a drain and a source and the energy of the two-dimensional electron gas becomes higher, the electrons in the two-dimensional electron gas are transferred to the n-AlInAs layer 14 as shown by the arrow mark in the drawing.

Generally, a high electric field is imposed across a drain and a source during its operation, and because a carrying characteristic of electrons in the AlInAs layer is inferior to that of the InGaAs layer, when this real space transfer occurs, it deteriorates the high-frequency characteristic of the FET.

Also as in the fourth HEMT of the prior art hereinbefore described, even for a system using the hetero/junction of AlGaAs/InGaAs, electrons travel in an InGaAs layer which will be a channel and such electrons sometimes produce real space transition for transferring to the AlGaAs layer disposed in the upper layer of the InGaAs layer. This real space transfer can be explained as follows. An energy band in FIG. 6 is formed at the hetero/junction portion of the n-AlGaAs layer and the undoped InGaAs layer, and the two-dimensional electron gas is accumulated at the oblique lined portion of the drawing. However, if a high electric field is applied across a drain and a source and the energy of the two-dimensional electron gas becomes higher, the electrons in the two-dimensional electron gas make transition to the n-AlGaAs layer as shown by the arrow mark in the drawing.

Generally, a high electric field is applied across a drain and a source during its operation, and because carrying characteristic of electrons in the AlInAs layer is inferior than in as compared to the InGaAs layer, when a real space transfer occurs, it deteriorates the high-frequency characteristic of the FET.

The first HEMT of the prior art abovementioned uses as a channel a two-dimensional electron gas layer 8 in FIG. 1 (See FIG. 1) produced on a heterojunction interface between the undoped InP layer 2 and the n-AlInAs layer 3. This channel is formed within InP having a higher electron saturating speed than GaAs or InGaAs, thus producing a high-frequency device with upgraded performance. However, a limit has been placed against raising the electron gas density because the maximum current density of such HEMT is determined by the upper limit of two-dimensional electron gas density and the channel layer being in two-dimensional status. This results in an inability to produce a high-frequency device exhibiting a satisfactorily large output.

The fact as hereinbefore described applies also to the conventional cases of the second, third, and fourth HEMTs of the prior art. Electron gas density cannot be satisfactorily increased by the conventional second HEMT because the second HEMT uses as a channel a two-dimensional electron gas layer produced on a heterojunction interface between the undoped GaAs layer and the n-AlGaAs layer. Also, the electron gas density is not fully raised by the conventional third HEMT because the third HEMT uses as its channel a two-dimensional electron gas layer 19 (See FIG. 2) produced on a heterojunction interface between the undoped InGaAs layer 13 and the n-AlInAs layer 14. Likewise, the electron gas density is not fully raised by the conventional fourth HEMT because the fourth HEMT uses as its channel a two-dimensional electron gas layer produced on a heterojunction interface between the undoped InGaAs layer and the n-AlGaAs layer. Therefore high-frequency devices with a sufficiently high output have not been produced by the respective conventional HEMTs described above.

For other very high speed devices there has been developed, for example, a DMT (Doped-channel hereto MISFET) with the structures as in FIG. 7. A GaAs semiconductor substrate 21 has formed thereon an undoped GaAs layer 22, on which is formed an n$^+$-GaAs layer 23 that will be a channel. Further, on the n$^+$-GaAs layer 23 is formed an undoped AlGaAs layer 24 and an n$^+$-GaAs layer 25. A gate electrode 26 is formed in Schottky contact with an undoped AlGaAs layer 24 exposed at a recess, and ohmic electrodes 27 and 28 are formed on the n$^+$-GaAs layer Because such DMT uses a high density and thinly formed n$^+$-GaAs layer 23 as a channel layer, a sufficiently large output can be obtained. The AlGaAs layer 24 thereabove is undoped to improve its Schottky withstanding voltage. However in this DMT, because the channel layer contains a large amount of impurities the travelling speed of electrons in the channel layer is lowered as compared with that of HEMT. As a result a high-frequency operational characteristic of DMT was inferior to that of HEMT.

Furthermore, as the DMT, as in the case of the second HEMT hereinbefore described, uses the heterojunction of the AlGaAs/GaAs, the electrons travelling in the n$^+$-GaAs layer 23 that will be a channel, are sometimes in real spatial transition to the AlGaAs layer disposed in the upper layer of the n$^+$-GaAs layer 23. Thus due to this real spatial transition there is a case where the high-frequency characteristic of the FET is further degraded.

SUMMARY OF THE INVENTION

The present invention is made to solve such problems, and to form a field effect transistor (FET) comprising: a first semiconductor layer; a channel layer having a crystalline structure substantially lattice-matching the first semiconductor layer, the channel layer being thinly formed containing an "n" type impurity at a high concentration; a second semiconductor layer having a crystalline structure substantially lattice-matching the channel layer, the second semiconductor layer being lightly doped with impurity made of materials with a higher electron carrying characteristic than that of the channel layer; and a third semiconductor layer in heterojunction with the second semiconductor layer, the third semiconductor layer being lightly doped with impurity and in Schottky contact with a gate electrode.

In a FET of the structure in accordance with the present invention, if a higher electric field is applied across the drain and the source, electrons which travel in the channel layer including impurity at a high concentration obtain energy. Thus the electrons rush out to the first semiconductor layer and the second semiconductor layer both sandwiching the channel layer, to essentially travel in the second semiconductor layer excelling in electron carrying characteristic.

Because the channel layer is allowed to contain a high concentration of impurities the channel is formed by a large amount of electrons.

For this reason, according to the present invention a FET excelling in current driving function can be obtained without lowering the speed of the electron travelling in a channel.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENT

Figure 1:
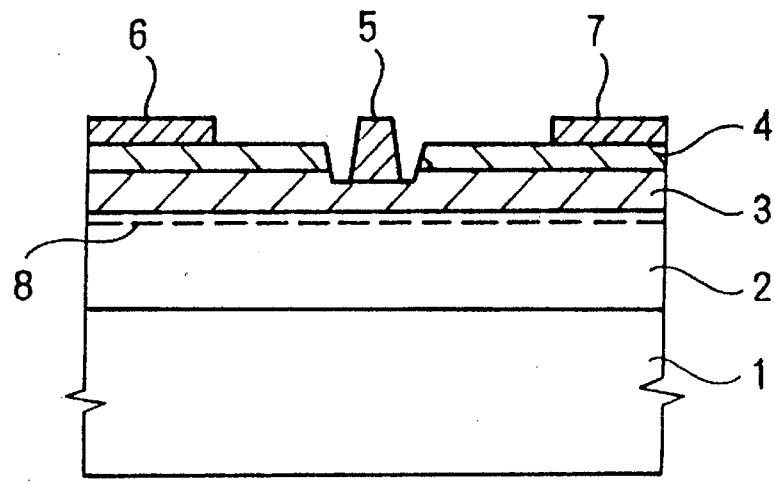
FIG. 1 is a sectional view of conventional first and second HEMTs.
Figure 2:
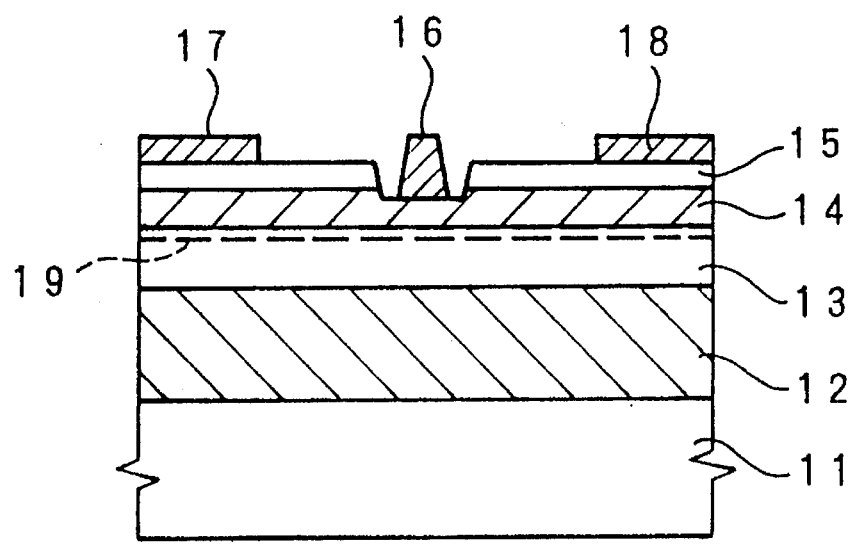
FIG. 2 is a sectional view of conventional third and fourth HEMTs.
Figure 3:
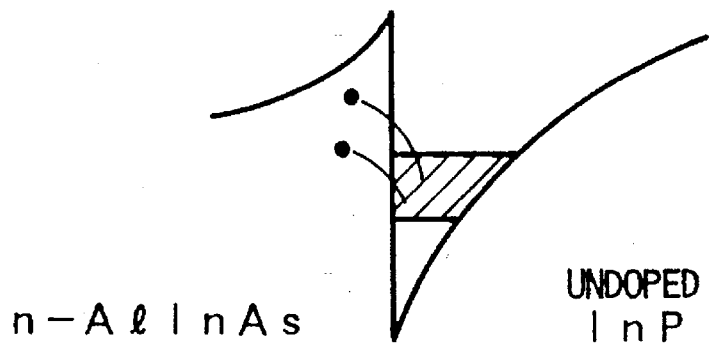
FIG. 3 is an energy band profile illustrating a real space transition in a heterojunction of a AlInAs/InP system of the first HEMT in the prior art.
Figure 4:
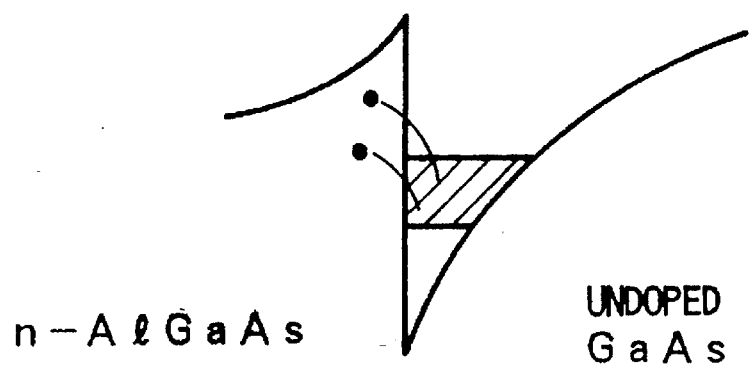
FIG. 4 is an energy band profile illustrating a real space transition in a heterojunction of a AlGaAs/GaAs system of the second HEMT in the prior art.
Figure 5:
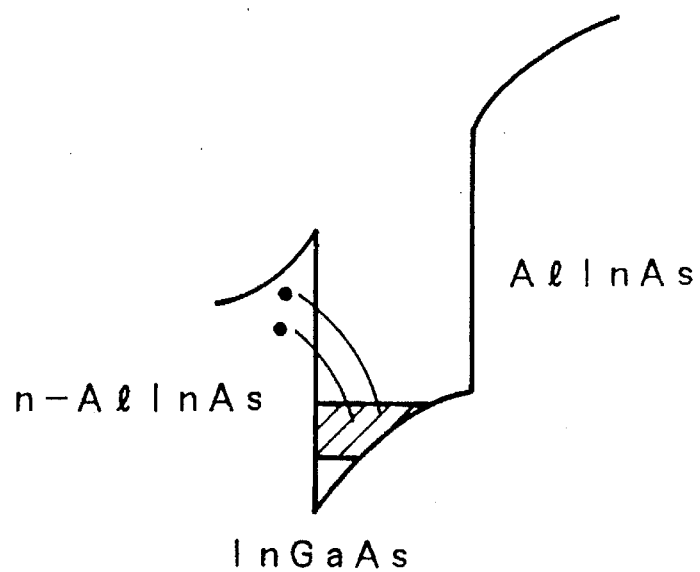
FIG. 5 is an energy band profile illustrating a real space transition in a heterojunction of a AlInAs/InGaAs system of the third HEMT in the prior art.
Figure 6:
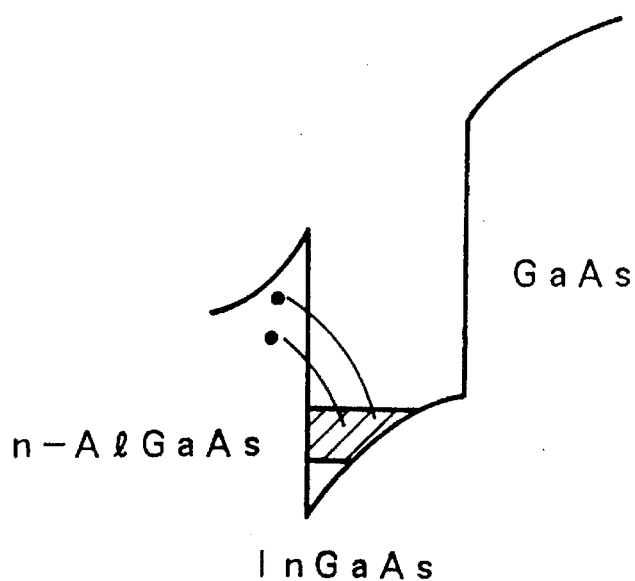
FIG. 6 is an energy band profile illustrating a real space transition in a heterojunction of AlGaAs/InGaAs system of the fourth HEMT in the prior art.
Figure 7:
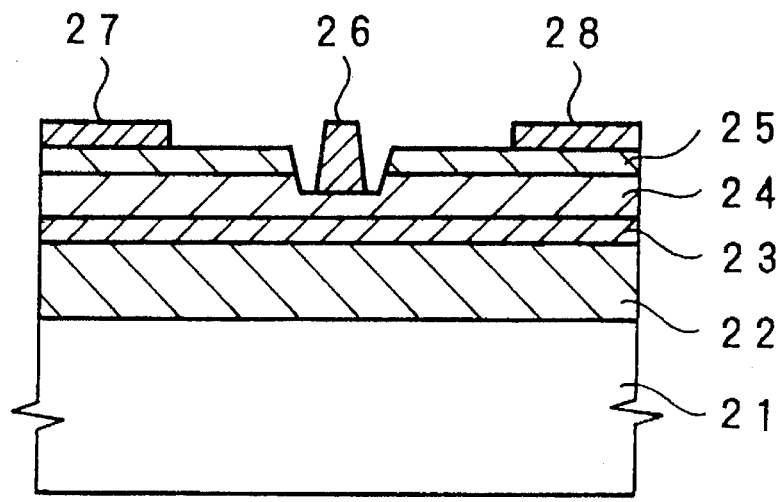
FIG. 7 is a sectional view showing a conventional DMT.
Figure 8:
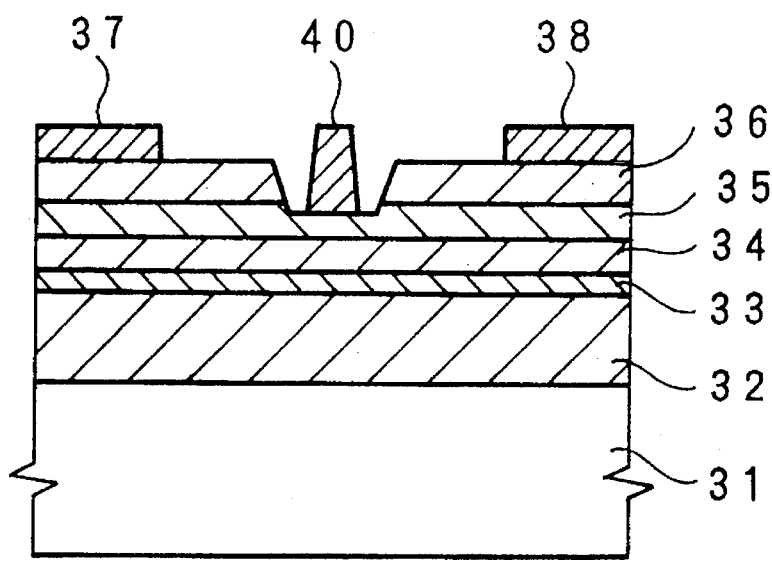
FIG. 8 is a sectional view of a FET with reference to first and the second embodiments according to the present invention.

FIG. 8 shows a structure of a FET according to a first embodiment of the present invention. A method of producing the same is shown by a sectional view of processing steps in FIGS. 9A to 9C, which is described below.

Figure 9A:
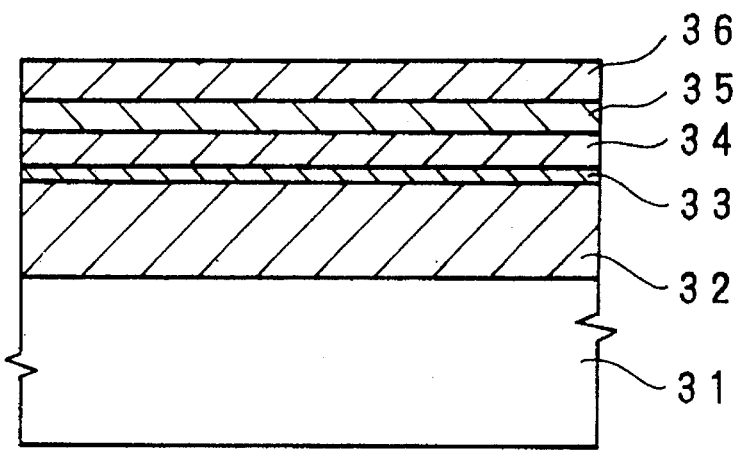
FIGS. 9A, 9B and 9C are sectional views of processing steps showing a method of producing a FET with reference to the first and the second embodiments as shown in FIG. 8.
Figure 9B:
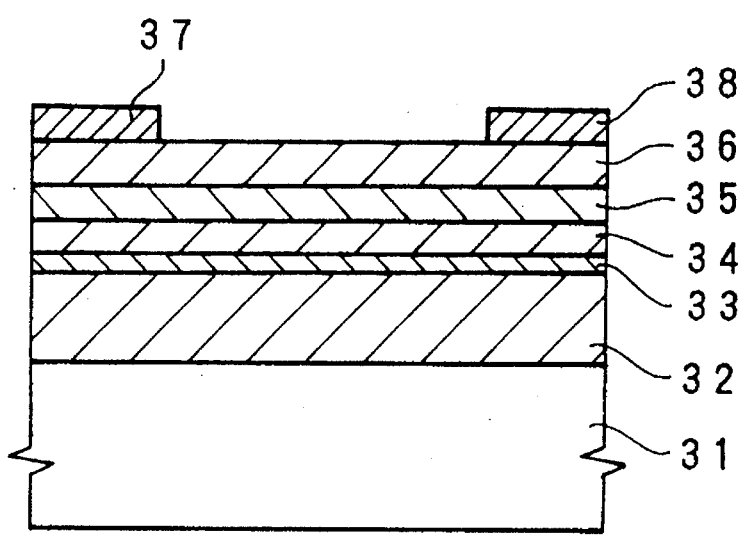
Figure 9C:
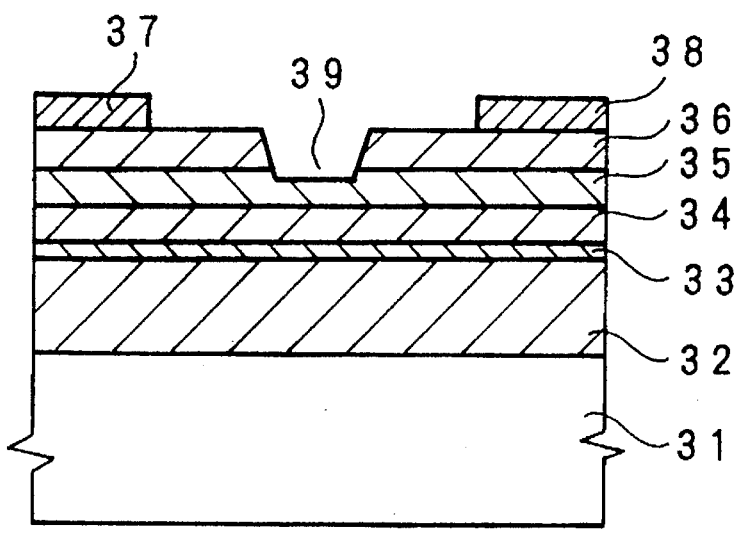

On a semi-insulative InP semiconductor substrate 31 there are sequentially epitaxially grown a first semiconductor layer 32, a channel layer 33, a second semiconductor layer 34, a third semiconductor layer 35, and a contact layer 36 (see FIG. 9A). The epitaxial growth is carried out by an MBE (molecular beam epitaxy) method or an OMVPE (organic metal vapor phase epitaxy) method.

The first semiconductor layer 32 is made of undoped InP with thickness of 1 μm. The channel layer 33 is made of n+ type InP doped by Si at a concentration of $2 \times 10^{18}/cm^3$, the thickness being 100 Å. The second semiconductor layer 34 is made of undoped InP with a thickness of 200 Å and having a higher electron carrying characteristic than the channel layer 33. The third semiconductor layer 35 is made of undoped $Al_xIn_{x-1}As$ having a thickness of 200 Å with an Al composition ratio X of 0.4 or more and 0.6 or less ($0.4 \leq x \leq 0.6$). The contact layer 36 is made of $n^+$ type InGaAs having a thickness of 500 Å with donors doped at a concentration of $4 \times 10^{18}/cm^3$.

Here the channel layer 33 has a carrier density and thickness enough to form a quantum well that will be described later. Electrons within the channel layer 33 have energy, therefore they exist in a slightly more expanded region than the thickness of the channel layer 33. In view of this, the second semiconductor layer 34 disposed on the channel layer 33 has a thickness allowing for the expanded region of, so that the electrons may not reach the third semiconductor layer 35.

Figure 10:
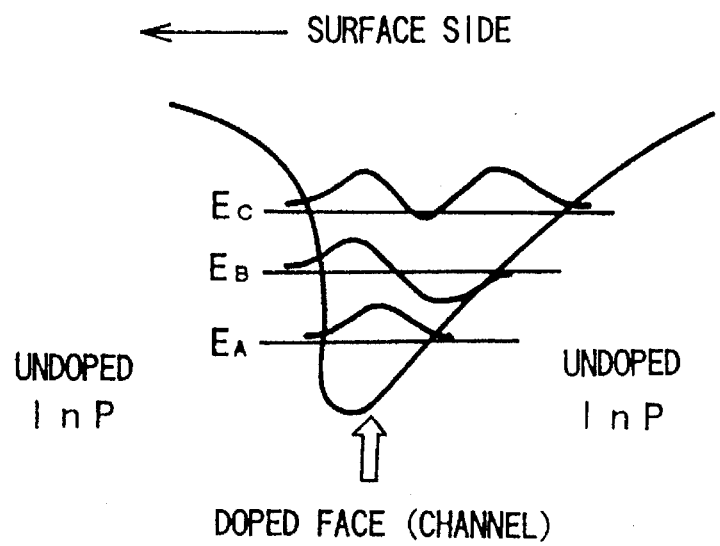
FIG. 10 shows an energy band adjacent to a channel of the FET with reference to the first embodiment.

That is, the energy band adjacent with the channel of the first semiconductor layer 32, the channel layer 33, and the second semiconductor layer 34 will take a structure as shown in FIG. 10. The drawing on its left shows the surface of the substrate, and the center portion corresponds to a channel doping surface. The channel layer 33 having higher density with thinner structure is sandwiched on both of its sides by the semiconductor layers 32 and 34, the thickness being as thin as and a conducting band produces a bent portion to form a V like potential to form a quantum well as shown in the drawing. Incidentally, the channel layer 33 is made to have a thickness of 100 Å, but for forming the quantum well on the conducting band, the channel layer may preferably have a certain specific thinness, for example, 200 Å or less.

The electrons in the channel layer when being at a ground state exist in the lowest subband $E_A$. By obtaining energy when an electric field is applied, the electrons are sequentially transferred to a second subband $E_B$ and a third subband $E_C$ positioned above the subband $E_A$, and move successively to higher energy leveled subbands.

An existential probability of electrons represents expansion of a wave function at the respective subbands as in FIG. 10, and approximates zero at the portion slightly more expanded than the thickness of the channel layer 33. The undoped InP layer at the substrate surface or the second semiconductor layer 34 has a thickness such that the electrons existing in the expanded region may not reach the third semiconductor layer 35.

The third semiconductor layer 35 is formed by Schottky contact with the gate electrode to be described later (see FIG. 9A). The semiconductor layer 35 has enough thickness to prevent the current from flowing from the gate electrode to the second semiconductor 34 by a tunnel effect. The third semiconductor layer 35, the second semiconductor layer 34, and the channel layer 33, while their respective thickness satisfies the conditions relating to layer thickness hereinbefore described, provide a total thickness of such layers thin enough to satisfy operational characteristics of the FET. Such total thickness may preferably be 500 Å or less. The topmost contact layer 38 is to protect the substrate surface and to take ohmic-contact with the drain and source electrodes as hereinafter described and has no relation with the essence of the invention.

After such layers are sequentially formed on the semiconductor substrate 31, the topmost contact layer 36 is formed thereon with AuGe/Ni metal. Next, an ohmic electrode pattern is formed using an ordinary photolithography technique, and a drain electrode 37 and a source electrode 38 ohmic-contacting with the contact layer 36 are formed (see FIG. 9B). The contact layer 36 centered between the drain electrode 37 and the source electrode 38 is selectively removed by etching, to form a recess 39 (see FIG. 9C).

Next there is formed a gate electrode 40 made of Ti/Pt/Au metal in Schottky contact with the third semiconductor layer 35 being exposed at the recess As a result a FET is completed having a structure as shown in FIG. 8.

In the structure aforementioned, with voltage applied across the drain electrode 37 and source electrode 38, an electric field is applied on electrons in the channel layer 33. The electrons distributed in the subband $E_A$ move to the higher energy level subband $E_B$ by the energy given by the applied electric field. In the subband $E_A$ at the lowest position, the existential probability of electrons is high at the center portion of the channel layer 33 as shown by the expansion of the wave function in FIG. 10, electron speed is thereby lowered largely affected by the scattering of impurity. However, in the subbands $E_B$ and $E_C$ above the subband $E_A$, the existential probability of electrons has a peak value shifted from the center portion as shown in the drawing, thus being hardly affected by the scattering of impurity. As a result, the travelling speed of electrons in the channel layer 33 distributed in the subbands $E_B$ and $E_C$ with higher energy levels becomes increased.

When voltage applied across the drain and source is increased, a further higher electric field is applied to the electrons in the channel layer 33. Thus the electrons sequentially move to a even higher energy level subband to finally rush out from V shape potential into the first semiconductor 32 and second semiconductor 34 both sandwiching the channel layer 33. In this process, the amount of electrons rushing out is far greater in the second semiconductor layer 34 disposed on the channel layer 33, which allows the electrons to mostly travel in that second semiconductor layer 34. The layers 32 and 34 sandwiching the channel layer 33 are undoped in addition, a higher electron carrying characteristic is given to the second semiconductor layer 34, therefore, it becomes the essential passage of the electrons. Thus even when a highly doped channel layer 34 easily affected by impurity scattering is used, although the mobility of electrons is lower under low electric field compared with a conventional HEMT, a high frequency characteristic is exhibited equivalent to or higher than that of HEMT in actual operation of the device under a high electric field.

Also in the FET according to the present embodiment, the third semiconductor layer 85 and the channel layer 33 made of AlInAs are positioned at intervals more than a distance of the expansion of the wave function of the electrons in the channel layer 33 as described above. For this reason, deterioration of the high-frequency carrying characteristic due to the actual space transition does not arise like the conventional first HEMT as hereinbefore described in which the AlInAs layer having an inferior electron carrying characteristic and the channel layer made of InP both are in close vicinity with each other. In the conventional first HEMT a mutual conductance characteristic $g_m$ against change of a gate voltage $V_g$ had a peak of value $g_m$ for a certain specific gate voltage value. However, in the mutual conductance characteristic in this embodiment, a peak of value $g_m$ is maintained for the change of the gate voltage within a certain variation range. Therefore according to the embodiment, the designing of an FET becomes easier and it is possible to obtain an FET with stable characteristics, a higher gain can be always secured, thus resulting in an output without distortion.

The channel layer 33 has a thickness of a certain extent and has a structure being possible to dope impurity at a higher concentration, therefore the channel is formed of a large amount of electrons. This permits a far more excellent current drive capability compared with the conventional first HEMT wherein the current drive capability is limited by the upper limit of concentration of the two-dimensional electron gas.

The gate electrode 40 is in Schottky contact with the third semiconductor layer 35 made of undoped AlInAs. This makes a Schottky barrier higher and enables operation of the device at a higher-bias condition, resulting in improved output characteristics. Furthermore, the noise reduction performance is improved because of higher speed of the electrons travelling in the channel.

Therefore, the FET of the embodiment is effective when applied to a basic structure of super high frequency, high output elements with low noise.

In the first embodiment, it has been explained that the third semiconductor layer 35 made of AlInAs is formed on the second semiconductor layer 34 made of InP. However, it is generally considered as difficult to maintain a good interface crystallinity between AlInAs and InP. For this reason, an undoped InGaAs thin layer may be formed between the second semiconductor layer 34 and the third semiconductor layer 35 which will exhibit the same result as the embodiment described above.

It also has been explained that the first and second semiconductor layers 32 and 34 sandwiching the channel layer 33 are to be undoped InP. However it is not necessarily limited to such material. Other materials may be employed, for example, undoped InGaAs having a higher electron carrying characteristic with a crystalline structure substantially lattice-matching the channel layer 33 will exhibit the same effect as the embodiment abovementioned. Further, because the electrons forming the channel essentially travel in the second semiconductor layer 34, the first semiconductor layer 32 does not always have to be the same material as the second semiconductor layer 34 and may be a material having a crystalline structure substantially lattice-matching the semiconductor substrate 31 and the channel layer 33.

The present invention is now described for a FET according to a second embodiment. A structure of the FET of the second embodiment is similar to the FET of the first embodiment as shown in FIG. 8. A method of producing the same is also similar to the first embodiment and is produced through the same producing process illustrated in FIGS. 9A to 9C. A difference between the FETs of the first and second embodiments is the difference in materials forming the respective layers.

In this embodiment, a semi-insulative GaAs semiconductor substrate is used instead of the semi-insulative InP semiconductor substrate 31, the respective layers hereinafter described being sequentially and epitaxially grown on the semi-insulative GaAs semiconductor substrate.

The first semiconductor layer 32 made of the undoped InP is replaced by a new first semiconductor layer which is made of substantially undoped p-type GaAs with a thickness of 1 μm, the same as that of the previous first semiconductor layer 32. The substantially undoped state may preferably mean an impurity concentration of $5 \times 10^{17}$/cm$^3$ or less. The channel layer 33 made of the n$^+$ type InP is replaced by a new channel layer, which is formed of n$^+$ type GaAs doped with Si at a concentration of $2 \times 10^{18}$/cm$^3$ having the same thickness of 100 Å as the former channel layer 33. The second semiconductor layer 34 made of undoped InP is replaced by a new second semiconductor layer, which is made of substantially undoped n$^-$ type GaAs having a higher electron carrying characteristic than that of the channel layer and having a thickness of 200 Å, the same as the former second semiconductor layer 34. The third semiconductor layer 35 made of undoped AlInAs is replaced by a new third semiconductor layer, which is made of substantially undoped n$^-$ type Al$_x$Ga$_{1-x}$As having a composite ratio X of Al of above zero and 0.3 or less ($0 \leq X \leq 0.3$) with thickness of 200 Å, the same as that of the third semiconductor layer 35. The contact layer 36 made of the n+ type InGaAs is replaced by a new contact layer, which is made of n$^+$ type GaAs doped with donors at a concentration of $4 \times 10^{18}$/cm$^3$ with thickness of 500 Å, the same as that of the former contact layer 36. A gate electrode and an ohmic electrode are formed of the same materials as those of the first embodiment.

Figure 11:
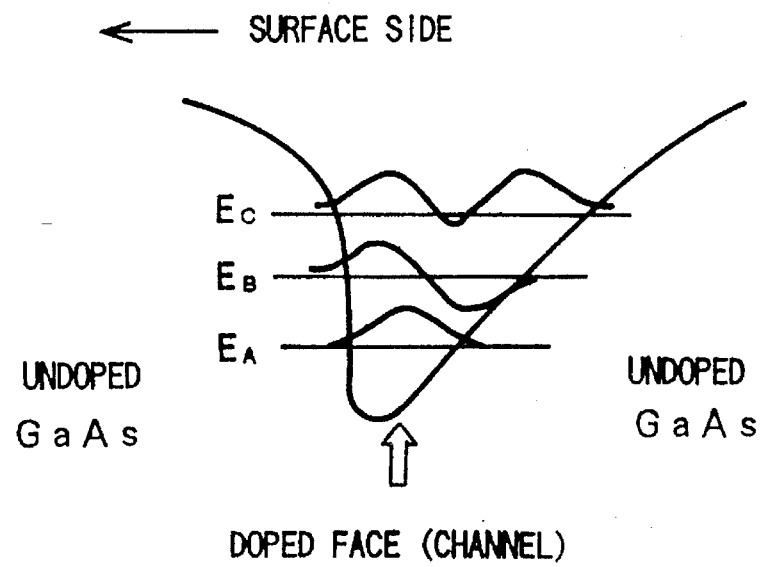
FIG. 11 shows an energy band adjacent to a channel of the FET with reference to the second embodiment.

An energy band adjacent to a channel of the FET according to the second embodiment has a structure the same as the first embodiment as shown in FIG. 11. Also in this second embodiment, the channel layer is of the n$^+$-GaAs having a high concentration and formed in thin layer, both sides of the channel layer are sandwiched by the first and second semiconductor layers made of substantially undoped GaAs with a thickness as thin as 100 Å. Thus a bent portion is produced in a conduction band to form a V shape potential to make up a quantum well shown in the drawing. The electrons in the n$^+$-GaAs channel in the embodiment also move sequentially to higher energy level subbands by obtaining energy by an electric field being applied.

In the second embodiment, as in the first embodiment, in the higher energy level subbands $E_B$ and $E_C$, the peak of existential probability of electrons is shifted from the center portion, therefore the electrons in the channel layer are hardly affected by scattering of impurity, resulting in a higher travelling speed of the electrons.

If the voltage applied across the drain / source is increased, the electrons in the channel layer finally 5 rush out from the V shape potential into the first and second semiconductor layers made of substantially undoped GaAs and sandwiching the channel layer. In this process, the amount of electrons rushing out is far greater in the second semiconductor layer, excelling in its carrying characteristics which is disposed on the channel layer, and hence as in the first embodiment the electrons in the channel layer travel at high speed. Therefore also in the second embodiment, even when a highly doped channel layer made of n+ type GaAs which is easily affected by scattering of impurity is used, although the electron mobility is low under a low electric field compared with a conventional HEMT, a high frequency characteristic equivalent to or more satisfactory than that of the HEMT is exhibited under the higher electric field in which the device is actually operated.

Also in the FET of the second embodiment, the third semiconductor layer made of AlGaAs and the channel layer made of GaAs are positioned at an interval of a distance more than the expansion of the wave function of the electrons in the channel layer. Thus a deterioration of high-frequency characteristic due to the actual space transition is not produced like the conventional second HEMT or DMT having a structure where the AlGaAs layer with an inferior carrying characteristic of electrons is in close vicinity with the channel layer. The mutual conductance characteristic of the FET in this second embodiment, also has a characteristic to maintain a peak value $g_m$ for a change of the gate voltage limited within a certain variation range. Therefore also in the second embodiment, the designing of an FET is made easier and the obtained FET characteristics are stable to always secure a higher gain, so that an output without distortion can be obtained.

Because the channel layer formed of the n+ type GaAs has a thickness of a certain extent, the channel layer can be doped with impurity at high concentration, therefore in the second embodiment also the channel is formed of a large amount of electrons. Thus, a far superior current drive capability can be obtained comparing with the conventional second HEMT where the current drive capability is limited by the upper limit of concentration of the two-dimensional electron gas.

In addition, in the second embodiment, because the gate electrode is in Schottky contact with the third semiconductor layer made of substantially undoped AlGaAs, the Schottky barrier becomes higher. In view of this, the device can be operated under the condition of a large bias, resulting in an upgraded output characteristic. The noise reduction characteristic also is improved because of a higher electron speed travelling in the channel.

The FET according to the second embodiment also is effective when applied to the basic structure of super high frequency, high output elements with lower noise.

Incidentally, it has explained in the second embodiment that the first and second semiconductors sandwiching the channel layer are to be undoped GaAs, however it is not necessarily limited to such material. Other materials may be employed, for example, an undoped InGaAs having a higher electron carrying characteristic with a crystalline structure substantially lattice-matching the channel layer will exhibit the same effect as the second embodiment mentioned above.

Furthermore, because the electrons forming the channel essentially travel in the second semiconductor layer made of substantially undoped GaAs, the first semiconductor layer does not necessarily have to be of the same material as the second semiconductor layer and may have a crystalline structure substantially lattice-matching the GaAs substrate and the n+ type GaAs channel layer.

Figure 12:
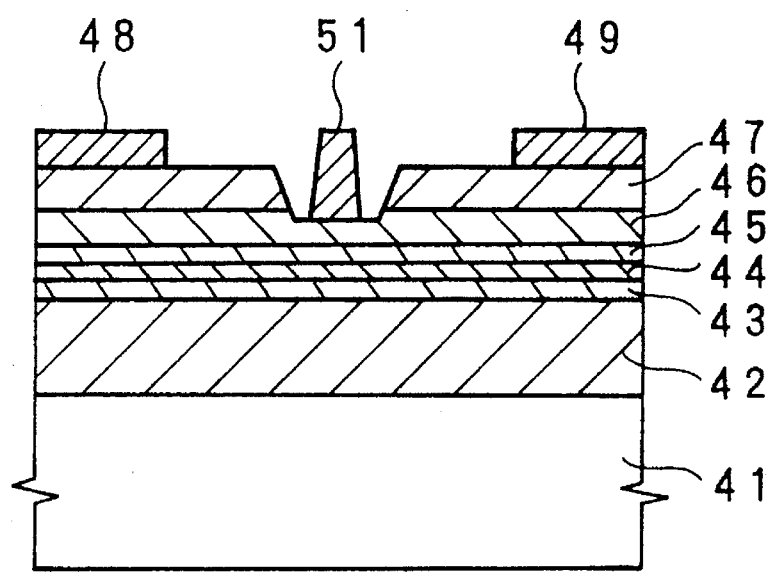
FIG. 12 is a sectional view of a FET with reference to the third and the fourth embodiments according to the present invention.

The present invention is now described for a FET according to a third embodiment. FIG. 12 shows a structure of the FET according to the third embodiment of the present invention. A method of producing the same is shown in sectional views of a production process in FIGS. 13A to 13C. The method of producing in this case is as follows.

Figure 13A:
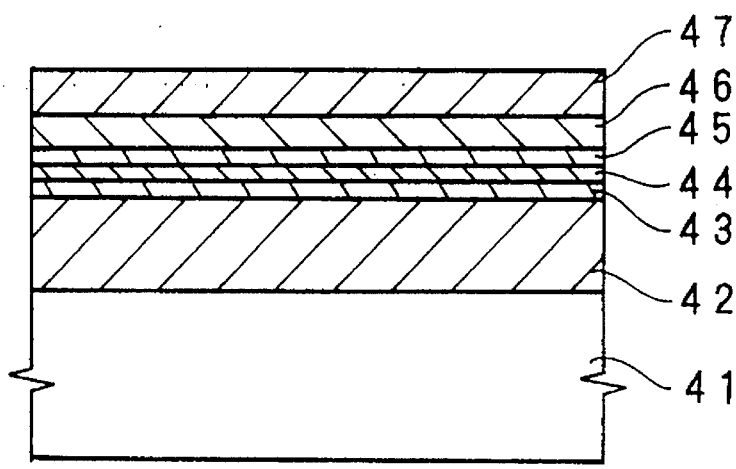
FIGS. 13A, 13B and 13C are sectional views of processing steps showing a method of producing a FET with reference to the third and the fourth embodiments as shown in FIG. 12.

On a semi-insulator InP semiconductor substrate 41 there are sequentially and epitaxially grown a buffer layer 42 for lattice-matching the substrate 41, a first semiconductor layer 43, a channel layer 44, a second semiconductor layer 45, a third semiconductor layer 46, and a contact layer 47 (see FIG. 13A). This epitaxial growth is carried out by the MBE method or OMVPE method as in the respective embodiments abovementioned.

The buffer layer 42 for lattice-matching the substrate 41 is made of undoped AlInAs with a thickness of 1 μm. The first semiconductor layer 43 is made of undoped $In_yGa_{1-y}As$ having a composition ratio Y of In of 0.45 or more and 0.65 or less ($0.45 \leq Y \leq 0.65$) and a thickness of 100 Å. The channel layer 44 is made of $n^+$ type $In_yGa_{1-y}As$ ($0.45 \leq Y \leq 0.65$) doped with Si at a concentration of $2 \times 10^{18}/cm^3$ with a thickness of 100 Å. The second semiconductor layer 45 is made of undoped $In_yGa_{1-y}As$ ($0.45 \leq Y \leq 0.65$) having a thickness of 100 Å and a higher electron carrying characteristic than that of the channel layer 44. The third semiconductor layer 46 is made of undoped $Al_xIn_{1-x}As$ having a composition ratio X of Al of 0.4 or more and 0.6 or less ($0.4 \leq X \leq 0.06$) and a thickness of 200 Å. The contact layer 47 is made of n+ type InGaAs doped with donors at a concentration of $4 \times 10^{18}/cm^3$ with a thickness of 500 Å.

Here, the channel layer 44 has a carrier density and thickness enough to form a quantum well as in the first and second embodiments as hereinbefore described. Because the electrons in the channel layer 44 have energy, they exist in a region slightly more expanded than the thickness of the channel layer 44. For this reason, the second semiconductor layer 45 disposed on the channel layer 44 has a thickness allowing for the expanded region, so that the electrons will not reach the third semiconductor layer 46.

Figure 14:
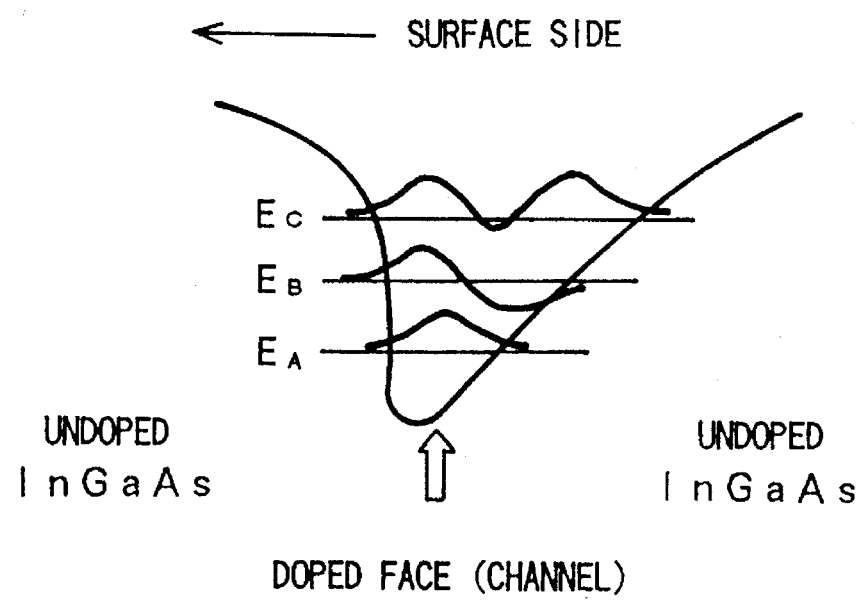
FIG. 14 shows an energy band adjacent to a channel of the FET with reference to the third and the fourth embodiments.

An energy band adjacent to a channel of the FET according to the third embodiment has a structure the same as the respective embodiments as shown in FIG. 14. Also in this third embodiment, the channel layer 44 is made of $n^+$-$In_yGa_{1-y}As$ having a high concentration and thinly formed, and both sides of the channel layer 44 are sandwiched by the first and second semiconductor layers 43 and 45 made of undoped $In_yGa_{1-y}As$ with a thickness of as thin as 100 Å. Thus a bent portion is formed in a conduction band to produce a V shape potential and to provide a quantum well as shown in the drawing. Also in the third embodiment, the thickness of the channel layer 44 is preferred to have a certain thinness enough to form a quantum well at the conduction band, for example, 200 Å or less. Also, the second semiconductor layer 45 has a thickness allowing the electrons expanded into the channel layer 44 not to reach the third semiconductor layer 46.

The gate electrode to be described later is formed by being in Schottky contact with tile third semiconductor layer 46, which has enough thickness to prevent the current from flowing from the gate electrode to the second semiconductor layer 45 by a tunnel effect. The third semiconductor layer 46, the second semiconductor layer 45, and the channel layer 44, while satisfying the respective conditions relating to the layer thickness as abovementioned, the total thickness thereof is thin enough to satisfy the operational performance of the FET. Such total thickness may preferably be 500 Å or less. The contact layer 47 being the topmost layer is provided for protecting the substrate surface and for making ohmic contact with the drain / source electrodes. Hence that contact layer has no relation to the essence of the invention.

Next, after the respective layers have been sequentially formed on the semiconductor substrate 41 as hereinbefore described, AuGe/Ni metal is formed on the contact layer 47 being the topmost layer. An electrode pattern is formed using an ordinary photolithography technique, and a drain electrode 48 and a source electrode 49 are formed in ohmic contact with the contact layer 47 (see FIG. 13B). Next, the contact layer 47 centered between the drain electrode 48 and source electrode 49 is selectively removed by etching to form a recess 50 (see FIG. 13C).

In the next process, there is formed a gate electrode 51 made of Ti/Pt/Au in Schottky contact with the third semiconductor layer 48 exposed at the recess 50. As a result the FET having a structure as shown in FIG. 12 is completed.

Also in the present embodiment, the electrons in the channel layer 44 made of $n^+$-$In_yGa_{1-y}As$ move successively to higher energy level subbands by obtaining energy from an electric field being applied. Therefore, also in this third embodiment, the same as in the respective previous embodiments, because the peak of an existential probability of the electrons is shifted from the center portion at the higher energy level subbands $E_B$ and $E_C$, the electrons in the channel layer 44 are hardly affected by scattering of impurity, resulting in a higher travelling speed of the electrons.

If the voltage applied across the drain / source is raised, the electrons in the channel layer 44 finally rush out from the V shape potential into the first and second semiconductor layers 43 and 45 made of undoped $In_yGa_{1-y}As$ sandwiching the channel layer 44. In this process, the amount of electrons rushing out is far greater in the second semiconductor layer 45 excelling in electron carrying characteristic and disposed on the channel layer 44, hence as in the respective embodiments hereinbefore described, the electrons in the channel travel at a high speed. Therefore also in the third embodiment, even when a highly doped channel layer 44 made of the $n^+$ type $In_yGa_{1-y}As$ easily affected by scattering of impurity is used, a high-frequency characteristic equivalent to or superior to that of the HEMT is exhibited under a higher electric field in which the device is actually operated, although the electron mobility at a low electric field is lower compared with that of the conventional HEMT.

Also in the FET of the third embodiment, the third semiconductor layer 46 made of AlInAs and the channel layer 44 made of n+ type $In_yGa_{1-y}As$ are positioned at an interval of a distance more than the expansion of the wave function of the electrons in the channel layer 44. Therefore a deterioration of the high-frequency characteristic due to the actual space transition is not produced like the conventional third HEMT having a structure where the AlInAs layer with an inferior carrying characteristic of electrons is in close vicinity of to the channel layer. Also in the mutual conductance characteristic of the FET according to the third embodiment, it has a characteristic of a peak of the $g_m$ value which is maintained against the change of the gate voltage within a certain variation range. Therefore according to the third embodiment also, the designing of the FET is easier and a stable FET characteristic is obtained, a higher gain is always secured, and as a result an output without distortion is obtained.

The channel layer 44 formed of the $n^+$ type $In_yGa_{1-y}As$ has a thickness of a certain extent so that the channel layer 44 can be doped with impurity at a high concentration, therefore in the third embodiment also the channel is formed of a large amount of electrons. Thus, far superior current drive capability can be obtained compared with the conventional third HEMT wherein the current drive capability is limited by the upper limit of concentration of the two-dimensional electron gas.

In addition, in the third embodiment, because the gate electrode 51 is in Schottky contact with the third semiconductor layer 46 made of undoped AlInAs, the Schottky barrier becomes high. Therefore the device can thus be operated under the condition of high bias which upgrades the output characteristic. Furthermore the noise reduction characteristic also is improved because of a higher electron speed when travelling in the channel.

In view of above, the FET according to the third embodiment is effective if applied to the basic structure of elements requiring super-high frequency and large output with lowered noise.

It has been explained in tile third embodiment that the first and second semiconductor layers 43 and 45 sandwiching the channel layer 44 are undoped InGaAs. However it is not necessarily limited to such material in this embodiment. Other materials may be employed, for example, undoped InP having a higher electron carrying characteristic with a crystalline structure substantially lattice-matching the channel layer 44 will exhibit the same effect as the third embodiment abovementioned. Furthermore, because the electrons forming the channel essentially travel in the second semiconductor layer 45 made of undoped InGaAs, the first semiconductor layer 43 does not necessarily have to be the same material as the second semiconductor layer 45, and it may be a material having a crystalline structure substantially lattice- matching the InP semiconductor substrate 41 and the n+ type InGaAs channel layer 44.

Figure 13B:
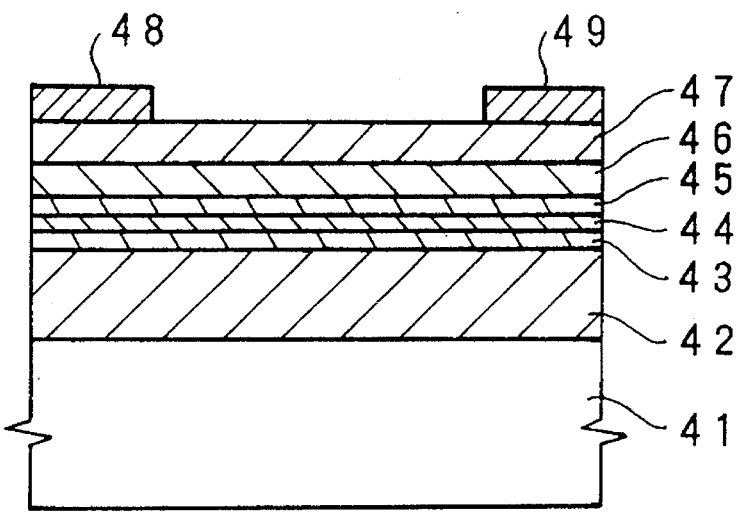
Figure 13C:
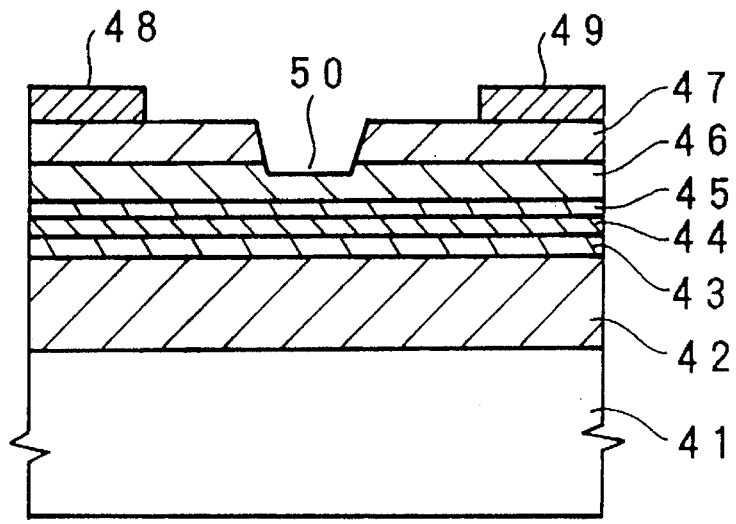

The present invention is now described for a FET according to a fourth embodiment. FIG. 12 also shows a structure of the FET according to the fourth embodiment of the present invention. A method of producing the same is similar to that of the third embodiment as shown in FIG. 13A to 13C, and produced through similar processing steps as shown in FIGS. 13A to 13C. The difference between the FETs according to the fourth and third embodiments is the difference in materials forming respective layers.

A semi-insulative GaAs semiconductor substrate is used instead of the semi-insulative InP semiconductor substrate 41, and following layers are sequentially epitaxially grown on the semi-insulative GaAs semiconductor substrate.

The buffer layer 42 made of undoped AlInAs for lattice-matching the substrate 41 is replaced by another buffer layer which is made of undoped GaAs with a thickness of 1 μm, the same as the former buffer layer 42. The first semiconductor layer 43 made of the undoped $In_yGa_{1-y}As$ ($0.45 \leq y \leq 0.65$) is replaced by a new first semiconductor layer, which is made of undoped $In_yGa_{1-y}As$ having a composition ratio "y" of In of zero or more and 0.35 or less ($0 \leq y \leq 0.35$) with a thickness of 50 Å. The channel layer 44 made of the $n^+$ type $In_yGa_{1-y}As$ ($0.45 \leq y \leq 0.65$) is replaced by a new channel layer, which is made of $n^+$ type $In_yGa_{1-y}As$ ($0 \leq y \leq 0.35$) doped with Si at a concentration of $2 \times 10^{18}/cm^3$ having a thickness of 100 Å, the same as that of the former channel layer 44. The second semiconductor layer 45 made of the undoped $In_yGa_{1-y}As$ ($0.45 \leq y \leq 0.65$) is replaced by a new second semiconductor layer, which is made of undoped $In_yGa_{1-y}As$ ($0 \leq y \leq 0.35$) having a higher electron carrying characteristic than that of the channel layer and a thickness of 100 Å, the same as the former second semiconductor layer 45. The third semiconductor layer 46 made of the undoped $Al_xIn_{1-x}As$ ($0.4 \leq X \leq 0.6$) is replaced by a new third semiconductor layer, which is made of undoped $Al_xGA_{1-x}As$ having a composition ratio X of Al of zero or more and 0.3 or less ($0 \leq X \leq 0.3$) and a thickness of 200 Å, the same as that of the former third semiconductor 46.

Also, a new contact layer is formed with the same materials and thickness as those of the former contact layer 47 made of the $n^+$ type InGaAs. A gate electrode and an ohmic electrode are formed in likewise manner and with the same materials as those of the third embodiment.

An energy band adjacent to a channel of the FET according to the fourth embodiment has a structure the same as the third embodiment as hereinbefore described in FIG. 14. Also in this fourth embodiment, the channel layer is made of a high concentration and thinly form $n^+$-$In_yGa_{1-y}As$ layer, and both sides of the channel layer are sandwiched by the first and second semiconductor layers made of the undoped $In_yGa_{1-y}As$ and formed thinly to a thickness of 100 Å. Thus a bent portion is produced in a conduction band to form a V shape potential and to provide a quantum well shown in the drawing. In the present embodiment, the electrons in the channel layer made of $n^+$-$In_yGa_{1-y}As$ also move successively to a plurality of higher energy level subbands by obtaining energy from an electric field being applied. Therefore in the fourth embodiment also, as in the respective previous embodiments, since the peak of an existential probability of the electrons is shifted from the center portion at the higher energy level subbands $E_B$ and $E_C$, the electrons in the channel layer are hardly affected by scattering of impurity, thus resulting in a higher travelling speed of the electrons.

If the voltage impressed across the drain / source is raised, the electrons in the channel layer finally rush out from the V shape potential into the first and second semiconductor layers made of undoped $In_yGa_{1-y}As$ sandwiching the channel layer. In this process, the amount of electrons rushing out is far greater in the second semiconductor layer excelling in electron carrying characteristic and disposed on the channel layer, as in the respective embodiments hereinbefore described, and the electrons in the channel travel at a high speed. Therefore also in the fourth embodiment, even when a highly doped channel layer made of $n^+$ type $In_yGa_{1-y}As$ easily affected by scattering of impurity is used, a high-frequency characteristic equivalent to or superior to that of the HEMT is exhibited under a high electric field in which the device is actually operated, although the electron mobility at a low electric field is lower compared with that of the conventional HEMT.

Also in the FET of the fourth embodiment, the third semiconductor layer made of AlGaAs and the channel layer made of the $n^+$ type $In_yGa_{1-y}As$ are positioned at an interval of a distance more than the expansion of the wave function of the electrons in the channel layer. Thus a deterioration of the high-frequency characteristic due to the actual space transition is not produced like the conventional fourth HEMT having a structure where the AlGaAs layer with inferior carrying characteristic of electrons is in close vicinity with the channel layer. The mutual conductance characteristic of the FET according to the fourth embodiment, also has a characteristic wherein a peak of the value of $g_m$ is maintained against the change of the gate voltage within a certain variation range. Therefore also by the fourth embodiment, the designing of the FET is made easier and with a stable FET characteristic obtained, a higher gain is always secured, thus resulting in an output without distortion.

The channel layer formed of the $n^+$ type $In_yGa_{1-y}As$ has a thickness of certain extent so that the channel layer can be doped with impurity at a high concentration, hence also in the fourth embodiment the channel is formed of a large amount of electrons. Thus, far superior current drive capability can be obtained compared with the conventional fourth HEMT wherein the current drive capability is limited by the upper limit of concentration of the two-dimensional electron gas.

Because the gate electrode is in Schottky contact with the third semiconductor layer made of undoped AlGaAs, the Schottky barrier in the fourth embodiment also becomes high. The device can thus be operated under a high bias condition which upgrades the output characteristic. The noise reduction characteristic also is improved because the travelling speed of electron in the channel becomes higher.

The FET according to the fourth embodiment is effective when applied to the basic structure using elements requiring a super high-frequency and large output with lowered noise.

In the fourth embodiment it has been explained that the first and second semiconductor layers sandwiching the channel layer are to be undoped InGaAs. However it is not necessarily limited to such material. Other materials may be employed, for example, undoped GaAs having a higher electron carrying characteristic with a crystalline structure substantially lattice-matching the channel layer will exhibit the same effect as the fourth embodiment described above. Furthermore, because the electrons forming the channel essentially travel in the second semiconductor layer made of undoped InGaAs, the first semiconductor layer does not have to be necessarily the same material as the second semiconductor layer, and it may have a crystalline structure substantially lattice-matching the GaAs semiconductor substrate and the $n^+$ type InGaAs channel layer.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

I claim:

1. A field effect transistor comprising:

a first semiconductor layer;

a n conductivity type channel layer formed on said first semiconductor layer to be substantially lattice-matched with said first semiconductor layer and containing a high concentration of an impurity, the impurity causing said channel layer to be of n type conductivity;

a second semiconductor layer formed on said channel layer to be substantially lattice-matched with said channel layer and containing substantially no impurity;

a third semiconductor layer formed on said second semiconductor layer, said third semiconductor layer being substantially lattice-matched and forming a heterojunction with said second semiconductor layer, said third semiconductor layer containing substantially no impurity; and a gate electrode being in Schottky contact with said third semiconductor layer, said first and second semiconductor layers having a higher electron carrying characteristic than said channel layer.

2. A field effect transistor according to claim 1, wherein said second semiconductor layer has a predetermined thickness so as to prevent electrons in said channel layer from reaching said third semiconductor layer during operation of said field effect transistor.

3. A field effect transistor according to claim 2, wherein said predetermined thickness is greater than or equal to 100 Å.

4. A field effect transistor according to claim 1, wherein said channel layer has a thickness of more than 50 Å and less than 200 Å.

5. A field effect transistor according to claim 1, wherein said channel layer includes a carrier concentration from $2 \times 10^{18}$, to $8 \times 10^{18}$ cm$^{-3}$.

6. A field effect transistor according to claim 1, wherein said first semiconductor layer is formed on a semiconductor substrate.

7. A field effect transistor according to claim 1, wherein said first semiconductor layer is formed on a buffer layer, and said buffer layer is formed on a semiconductor substrate.

8. A field effect transistor according to claim 1, wherein said first semiconductor layer contains substantially no impurity.

9. A field effect transistor according to claim 1, further comprising:

a contact layer formed on said third semiconductor layer, and an ohmic electrode formed on said contact layer.

10. A field effect transistor according to claim 1, wherein said gate electrode is formed on a recess formed in said third semiconductor layer.

11. A field effect transistor according to claim 1, wherein:

said channel layer is made of n$^+$ type GaAs, and said third semiconductor layer is made of substantially undoped Al$_x$Ga$_{1-x}$As, wherein $0 \leq X \leq 0.3$.

12. A field effect transistor according to claim 11, wherein:

said first semiconductor layer is made of substantially undoped p$^-$ type GaAs, and said second semiconductor layer is made of substantially undoped n$^-$ type GaAs.

13. A field effect transistor comprising:

a first semiconductor layer;

a channel layer formed on said first semiconductor layer and being made of n$^+$ type In$_y$Ga$_{1-y}$As, wherein $0 \leq Y \leq 0.35$, doped with an impurity at a higher concentration and being substantially lattice-matched with said first semiconductor layer;

a second semiconductor layer formed on said channel layer and being made of substantially undoped semiconductor material and being substantially lattice-match with said channel layer;

a third semiconductor layer formed on said second semiconductor layer and being made of substantially undoped Al$_x$Ga$_{1-y}$As, where $0 \leq X \leq 0.3$, and being substantially lattice-matched with said second semiconductor layer to form a heterojunction therewith; and a gate electrode being in Schottky contact with said third semiconductor layer.

* * * * *

UNITED STATES PATENT AND TRADEMARK OFFICE
CERTIFICATE OF CORRECTION

PATENT NO. : 5,508,530
DATED : April 16, 1996
INVENTOR(S) : Shigeru NAKAJIMA

It is certified that error appears in the above-indentified patent and that said Letters Patent is hereby corrected as shown below:

ON THE TITLE PAGE:

In block [45], please change "Date of Patent: Apr. 16, 1996" to --**\*Date of Patent: Apr. 16, 1996**--.

Between block [73] (Assignee) and block [21] (Appl. No.), please insert:

--[\*]   Notice:   The term of this patent shall not extend beyond the expiration date of Pat. No. 5,436,470.--.

Signed and Sealed this

Third Day of September, 1996

*Attest:*

BRUCE LEHMAN

*Attesting Officer*   *Commissioner of Patents and Trademarks*